United States Patent
Yeh

(10) Patent No.: US 10,211,813 B2
(45) Date of Patent: Feb. 19, 2019

(54) CONTROL CIRCUIT, CONNECTION LINE AND CONTROL METHOD THEREOF

(71) Applicant: VIA TECHNOLOGIES, INC., New Taipei (TW)

(72) Inventor: Cheng-Chun Yeh, New Taipei (TW)

(73) Assignee: VIA TECHNOLOGIES, INC., New Taipei (TW)

( * ) Notice: Subject to any disclaimer, the term of this patent is extended or adjusted under 35 U.S.C. 154(b) by 269 days.

(21) Appl. No.: 14/976,363

(22) Filed: Dec. 21, 2015

(65) Prior Publication Data

US 2017/0047908 A1    Feb. 16, 2017

(30) Foreign Application Priority Data

Aug. 10, 2015  (TW) .............................. 104125900 A

(51) Int. Cl.
G06F 13/40 (2006.01)
H03H 11/28 (2006.01)

(52) U.S. Cl.
CPC ......... *H03H 11/28* (2013.01); *G06F 13/4086* (2013.01)

(58) Field of Classification Search
CPC . Y10T 307/74; Y10T 307/747; Y10T 307/76; Y10T 307/766; G06F 1/266; G06F 13/4086; H03H 11/28
USPC .......................................................... 307/130
See application file for complete search history.

(56) References Cited

U.S. PATENT DOCUMENTS

| | | | |
|---|---|---|---|
| 5,841,270 A * | 11/1998 | Do | G05F 3/245 323/314 |
| 7,268,561 B2 | 9/2007 | Zhu | |
| 7,982,428 B2 | 7/2011 | Kim | |
| 8,688,888 B1 | 4/2014 | Lin | |
| 2009/0002055 A1 * | 1/2009 | Kojima | H03K 17/063 327/434 |
| 2013/0009689 A1 * | 1/2013 | Santos | H03F 3/217 327/394 |

(Continued)

FOREIGN PATENT DOCUMENTS

| | | |
|---|---|---|
| CN | 202042887 U | 11/2011 |
| CN | 203707735 U | 7/2014 |
| TW | I296370 | 5/2008 |

OTHER PUBLICATIONS

Chinese language office action dated Aug. 9, 2016, issued in application No. TW 104125900.

(Continued)

*Primary Examiner* — Patrick C Chen

(74) *Attorney, Agent, or Firm* — McClure, Qualey & Rodack, LLP

(57) ABSTRACT

A control circuit disposed in a connection line including a first power pin and a second power pin and including a native N-type transistor, a first impedance unit, and a second impedance unit is provided. The native N-type transistor includes a first gate, a first drain and a first source. The first drain is coupled to the first power pin. The first impedance unit is coupled between the first source and the second power pin. The second impedance unit is coupled between the first drain and the first gate. When the voltage level of the first power pin is equal to a pre-determined level, the first gate of the native N-type transistor receives an adjusting signal to adjust an equivalent impedance of the native N-type transistor.

8 Claims, 4 Drawing Sheets

(56) References Cited

U.S. PATENT DOCUMENTS

| | | | |
|---|---|---|---|
| 2013/0300213 A1 | 11/2013 | Zhou | |
| 2013/0328117 A1* | 12/2013 | Hommelgaard | H01L 29/7881 257/315 |
| 2014/0266140 A1* | 9/2014 | Iriarte | G05F 3/242 323/313 |
| 2015/0301552 A1* | 10/2015 | Lim | H02J 7/0052 327/538 |
| 2016/0170929 A1* | 6/2016 | Pethe | G06F 13/102 710/313 |

OTHER PUBLICATIONS

Chinese language office action dated Jul. 21, 2017, issued in application No. CN 201510562380.2.

\* cited by examiner

CONTROL CIRCUIT, CONNECTION LINE AND CONTROL METHOD THEREOF

CROSS REFERENCE TO RELATED APPLICATIONS

This Application claims priority of Taiwan Patent Application No. 104125900, filed on Aug. 10, 2015, the entirety of which is incorporated by reference herein.

BACKGROUND OF THE INVENTION

Field of the Invention

The invention relates to a control circuit, and more particularly to a control circuit applied in a connection line.

Description of the Related Art

As technology develops, the types of electronic devices that are available on the market continues to increase. Each of these electronic devices is capable of communicating with a host device via a communication interface; a function for which current communication interfaces usually use a universal serial bus (USB).

BRIEF SUMMARY OF THE INVENTION

In accordance with an embodiment of the invention, a control circuit is disposed in a connection line including a first power pin and a second power pin, and includes a native N-type transistor, a first impedance unit, and a second impedance unit. The native N-type transistor includes a first gate, a first drain, and a first source. The first drain is coupled to the first power pin. The first impedance unit is coupled between the first source and the second power pin. The second impedance unit is coupled between the first drain and the first gate. When the voltage level of the first power pin is equal to a pre-determined level, the first gate of the native N-type transistor receives an adjusting signal to adjust an equivalent impedance of the native N-type transistor.

In accordance with another embodiment, a connection line includes a connection port, a native N-type transistor, a first impedance unit and a second impedance unit. The connection port is configured to couple to a host device and includes a first power pin and a second power pin. The native N-type transistor includes a first gate, a first drain and a first source. The first drain is coupled to the first power pin. The first impedance unit is coupled between the first source and the second power pin. The second impedance unit is coupled between the first drain and the first gate. When the voltage level of the first power pin is equal to a pre-determined level, the first gate of the native N-type transistor receives an adjusting signal to adjust an equivalent impedance of the native N-type transistor.

An exemplary embodiment of a control method for a connection line including a first power pin and a second power pin is described in the following. An impedance is provided between the first and second power pins. It is determined whether the voltage level of the first power pin is equal to a pre-determined level and the duration during which the voltage level of the first power pin is equal to the pre-determined level is equal to a pre-determined period. The resistance of the impedance is changed when the duration during which the voltage level of the first power pin is equal to the pre-determined level is equal to the pre-determined period.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
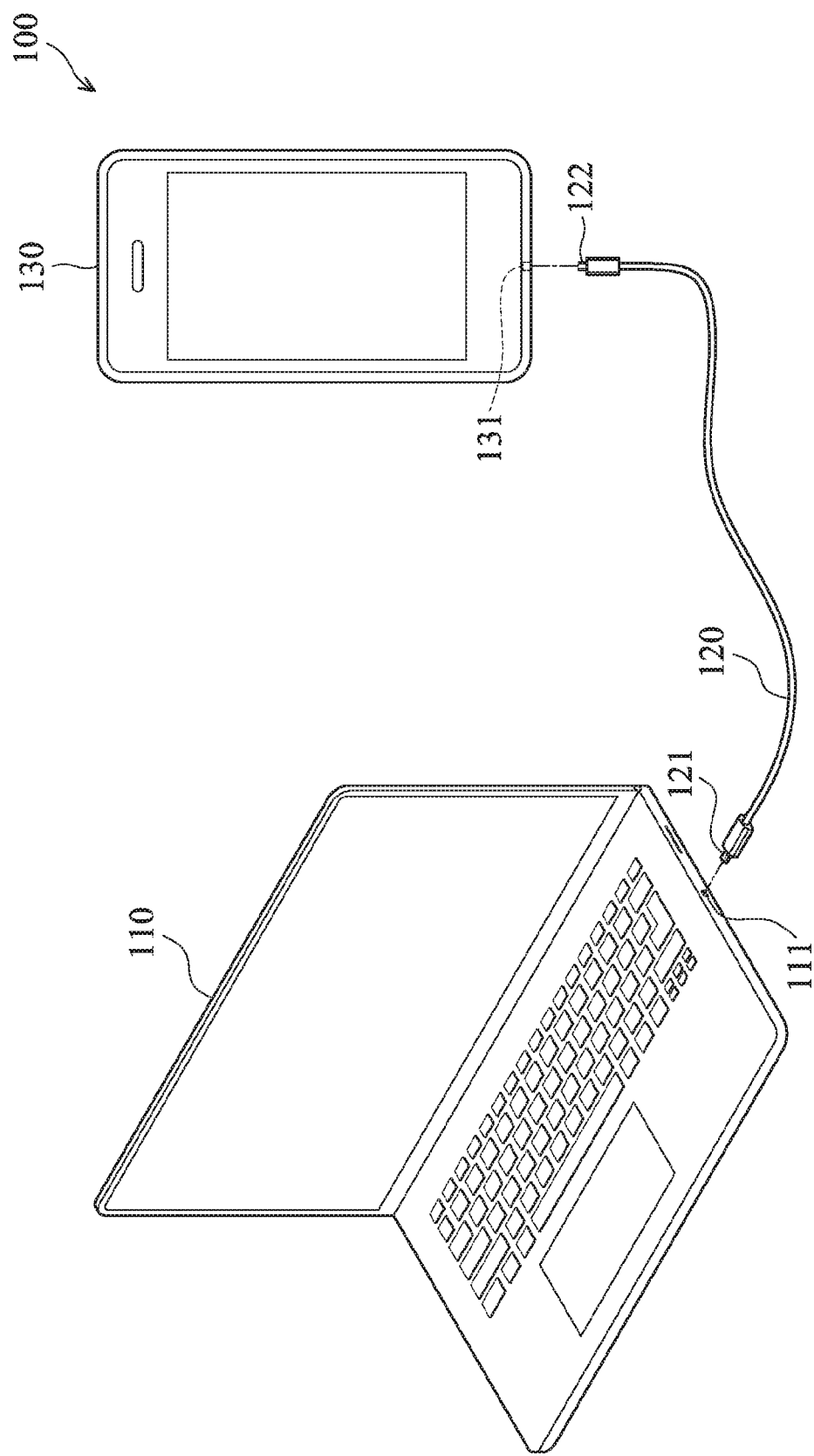
FIG. 1 is a schematic diagram of an operation system according to an embodiment of the present invention.

FIG. 1 is a schematic diagram of an operation system according to an embodiment of the present invention. The operation system 100 includes a host device 110, a connection line 120 and a peripheral device 130. The host device 110 accesses the peripheral device 130 via the connection line 120. In this embodiment, the host device 110 is a notebook computer, but the disclosure is not limited thereto. In other embodiments, any electronic device can be served as the host device 110, as long as the device is capable of processing signals. The host device 110 includes a connection port 111. The connection port 111 is configured to couple to a connection port 121 of the connection line 120.

The connection line 120 includes another connection port 122 to couple to the peripheral device 130. The invention does not limit the kinds of connection ports 111, 121, 122 and 131. In one embodiment, the connection ports 111, 121, 122 and 131 are USB connection ports. For example, the connection ports 111, 121, 122 and 131 are USB Type-C connection ports.

The peripheral device 130 utilizes the connection port 131 to couple to the connection port 122. The peripheral device 130 receives data provided from the host device 110 via the connection line 120 or provides data to the host device 110. In this embodiment, the peripheral device 130 is a mobile phone, but the disclosure is not limited thereto. In some embodiments, the peripheral device 130 is a USB flash drive, a hub or other electronic devices.

In one embodiment, the connection line 120 includes a chip (not shown) to store the property of the connection line 120, such as the length and the material of the connection line 120. The invention does not limit the position of the chip. The chip can be disposed in the connection line 120 anywhere. When the connection line 120 is connected to the host device 110, the host device 110 provides an appropriate voltage and signals to the connection line 120 according to the data stored in the chip.

Figure 2A:
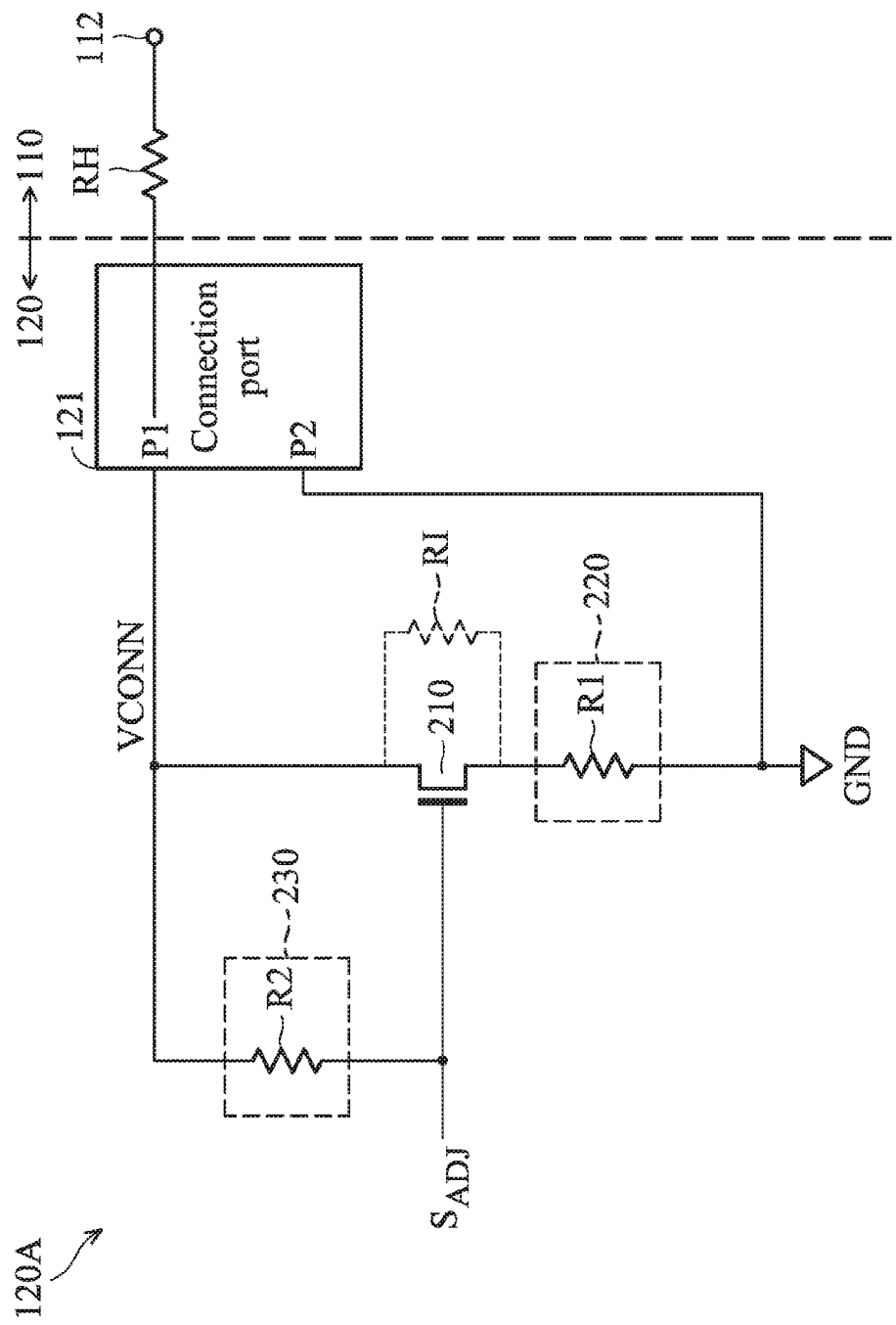
FIGS. 2A-2B are schematic diagrams of a connection line according to an embodiment of the present invention.

FIG. 2A is a schematic diagram of a connection line according to an embodiment of the present invention. For brevity, FIG. 2A only shows a single connection port, but the disclosure is not limited thereto. In some embodiments, the connection line 120A includes a plurality of connection ports to couple to a host device and a peripheral device. As shown in FIG. 2A, the connection line 120A includes the connection port 121, a native N-type transistor 210, impedance units 220 and 230. The connection port 121 includes a plurality of pins. For clarity, FIG. 2A only shows power pins P1 and P2. The power pins P1 and P2 are configured to receive power provided by the host device 110.

As shown in FIG. 2A, the drain of the native N-type transistor 210 is coupled to the power pin P1. The gate of the native N-type transistor 210 receives an adjusting signal $S_{ADJ}$. In one embodiment, the native N-type transistor 210 is a NMOS transistor. The impedance unit 220 is coupled between the source of the native N-type transistor 210 and the power pin P2. The impedance unit 230 is coupled between the gate and the drain of the native N-type transistor 210. In this embodiment, the resistor R1 serves as the impedance unit 220, and the resistor R2 serves as the impedance unit 230, but the disclosure is not limited thereto. In other embodiments, any element and circuit structure can serve as the impedance unit 220 or 230, as long as the element and circuit structure is capable of providing resistance.

The USB power delivery datasheet specifies that the host cannot immediately provide 5V to the USB connection line. The host must first determine whether the inserted connection line includes a resistor whose resistance is within 0.8 KΩ~1.2 KΩ. If the inserted connection line includes a resistor whose resistance is within 0.8 KΩ~1.2 KΩ, the host starts directly to provide 5V to the connection line. Therefore, when the connection port 121 is coupled to the host device 110, the host device 110 provides a voltage (e.g. 5V) to the power pin P1 via a resistor and utilizes a voltage divider to determine the voltage level of the power pin P1 during a first period. For example, the host device 110 includes a resistor RH. The resistor RH is connected between the power pin P1 and a node 112 in series. In this case, the node 112 is inside of the host device 110. The host device 110 provides a voltage (e.g. 5V) to the node 112 and provides a ground level GND to the power pin P2. The host device 110 detects the voltage level of the power pin P1. In this embodiment, the native N-type transistor 210 has a threshold voltage Vt less than 0. Additionally, the native N-type transistor 210 provides a diode connected type. In this case, the connection between the native N-type transistor 210 and the impedance unit 230 forms a diode connection type.

When the host device 110 provides a voltage (e.g. 5V) to the node 112, the resistor RH, the equivalent impedance RI and the impedance unit 220 divide the voltage to generate a divided voltage and provide the divided voltage to the power pin P1. The level of the divided voltage is a voltage level VCONN. At this time, since no current passes through the resistor R2, the level of the adjusting signal $S_{ADJ}$ is equal to the voltage level VCONN of the power pin P1. Furthermore, the voltage difference between the gate and source of the native N-type transistor 210 is greater than 0V. Therefore, the native N-type transistor 210 is turned on.

In one embodiment, the resistance sum of the equivalent impedances RI of the native N-type transistor 210 and the impedance unit 220 are designed within 0.8 KΩ~1.2 KΩ. Therefore, when the host device 110 applies voltage (e.g. 5V) to the node 112, the host device 110 determines whether the divided voltage which is generated by the resistors RH, RI and R1 is within 0.2V~0.8V. The divided voltage is also the voltage level VCONN of the power pin P1. If the divided voltage which is generated by the resistors RH, RI and R1 is within 0.2V~0.8V, it means that the voltage level VCONN of the power pin P1 is equal to a first pre-determined level, such as 0.2V~0.8V. Therefore, the host device 110 does not directly provide power to the power pin P1 via the resistor RH during a second period. For example, during the second period, the voltage level VCONN of the power pin P1 is approximately 5V, and the voltage level of the power pin P2 is the ground level GND.

In one embodiment, when the host device 110 directly provides power to the power pin P1 after a period of time (e.g. 1 sec), the adjusting signal $S_{ADJ}$ of the connection line 120 is changed from a high level to a low level during a third period. In another embodiment, when the host device 110 does not directly provide power to the power pin P1 or the duration during which the host device 110 provides the power to the power pin P1 is not equal to a predetermined period (e.g. 1 sec), the adjusting signal $S_{ADJ}$ of the connection line 120 is maintained at the high level.

When the adjusting signal $S_{ADJ}$ is at the low level, the voltage of the gate of the native N-type transistor 210 is reduced, the resistance of the equivalent impedance RI of the native N-type transistor 210 is increased. Since the resistance sum of the native N-type transistor 210 and the impedance unit 220 is increased, the current passing through the native N-type transistor 210 and the impedance unit 220 is reduced such that the power consumption is reduced. However, when the adjusting signal $S_{ADJ}$ is at the high level, the resistance of the equivalent impedance RI of the native N-type transistor 210 is not changed until the adjusting signal $S_{ADJ}$ is at the low level.

In another embodiment, when the connection port 121 is connected to the host device 110, the host device 110 provides a first voltage to the first power pin P1 via the resistor RH during a first period. Since the resistor RH is connected to the equivalent impedance RI and the resistor R1 in series, the voltage level of the first power pin P1 is equal to the divided voltage generated by the resistor RH, the equivalent impedance RI and the resistor R1. During a second period, the host device 110 does not utilize the resistor RH to provide power to the power pin P1. The host device 110 directly provides a second voltage (e.g. 5V) to the power pin P1. The second voltage is greater than the first voltage. During a third period, such as when the adjusting signal $S_{ADJ}$ is at the low level, the equivalent impedance of the native N-type transistor 210 is adjusted. The resistance of the equivalent impedance of the native N-type transistor 210 may be adjusted. In one embodiment, the resistance of the equivalent impedance of the native N-type transistor 210 is increased.

Figure 2B:
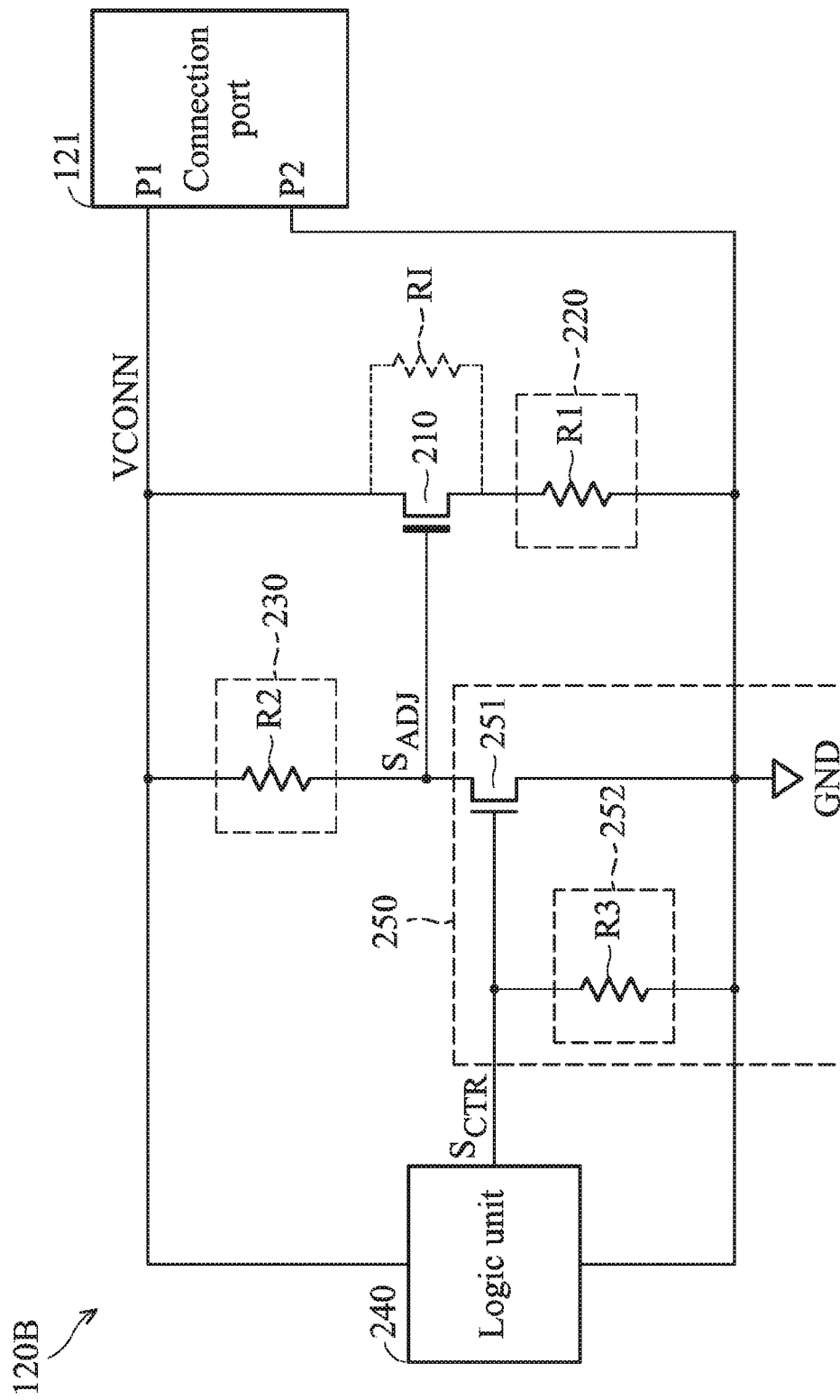

FIG. 2B is another schematic diagram of a connection line according to an embodiment of the present invention. FIG. 2B is similar to FIG. 2A with the except for the addition of the logic unit 240 and an adjustment unit 250. In this embodiment, the logic unit 240 detects the voltage level VCONN of the power pin P1 and generates a control signal $S_{CTR}$ according to the detection result. In one embodiment, the logic unit 240 includes a detection circuit (not shown) and a counter (not shown). The detection circuit is configured to detect whether the voltage level VCONN of the power pin P1 is equal to a second pre-determined level. The counter is configured to determine the duration during which the voltage level VCONN of the power pin P1 is equal to the second pre-determined level.

When the duration during which the voltage level VCONN of the power pin P1 is equal to the second pre-determined level is equal to a pre-determined period, the control signal $S_{CTR}$ is at the high level. However, when the voltage level VCONN of the power pin P1 is not equal to the second pre-determined level or the duration during which the voltage level VCONN of the power pin P1 is equal to the second pre-determined level is not equal to the pre-determined period, the logic unit 240 directs the control signal $S_{CTR}$ at the low level.

The adjustment unit 250 adjusts the adjusting signal $S_{ADJ}$ according to the control signal $S_{CTR}$. In this embodiment, the adjustment unit 250 includes a N-type transistor 251 and an impedance unit 252. The gate of the N-type transistor 251 receives the control signal $S_{CTR}$. The drain of the N-type transistor 251 is coupled to the gate of the native N-type transistor 210 to provide the adjusting signal $S_{ADJ}$. The source of the N-type transistor 251 is coupled to the power pin P2. The impedance unit 252 is coupled to the gate and source of the N-type transistor 251. In this embodiment, the impedance unit 252 is constituted by a resistor R3, but the disclosure is not limited thereto. In some embodiments, any element and circuit structure can serve as the impedance unit 252, as long as the element or the circuit structure is capable of providing resistance.

When the duration during which the voltage level VCONN of the power pin P1 is equal to the second pre-determined level is equal to a pre-determined period, the control signal $S_{CTR}$ is at the high level. Therefore, the N-type transistor 251 is turned on and the gate voltage of the native N-type transistor 210 is pulled to the ground level GND. At this time, since the voltage difference between the gate and source of the native N-type transistor 210 is less than 0V, the resistance of the equivalent impedance RI of the native N-type transistor 210 is increased such that the current passing through the impedance unit 220 is reduced.

In another embodiment, when the voltage level VCONN of the power pin P1 is not equal to the second pre-determined level or the duration during which the voltage level VCONN of the power pin P1 is equal to the second pre-determined level is not equal to the pre-determined period, the control signal $S_{CTR}$ is at the low level. Therefore, the N-type transistor 251 is turned off such that the resistance of the equivalent impedance RI of the native N-type transistor 210 is not adjusted until the duration during which the voltage level VCONN of the power pin P1 is equal to the second pre-determined level is equal to the pre-determined period.

Figure 3:
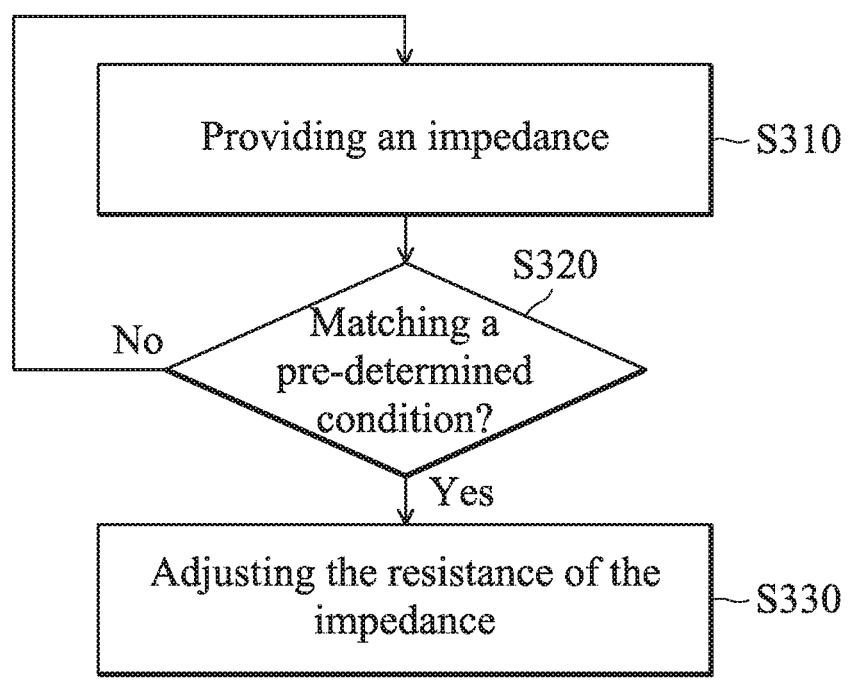
FIG. 3 is a flowchart schematic diagram of a control method according to an embodiment of the present invention.

FIG. 3 is a flowchart schematic diagram of a control method according to an embodiment of the present invention. The control method is applied to a connection line. The connection line includes a first power pin and a second power pin. First, an impedance is disposed between the first and second power pins (step S310). In one embodiment, the resistance of the impedance is a resistance sum of a native N-type transistor and a resistor and may be 0.8 K~1.2 KΩ.

It is determined whether the voltage level of the first power pin matches a pre-determined condition (step S320). In one embodiment, the pre-determined condition represents that the voltage level of the first power pin is equal to a pre-determined level and the duration during which the voltage level of the first power pin is equal to the pre-determined level is equal to a pre-determined period. In another embodiment, the pre-determined period may be 1 sec, but the disclosure is not limited thereto.

When the voltage level of the first power pin does not match the pre-determined condition, step S310 is performed and the resistance of the impedance is not adjusted until the voltage level of the first power pin matches the pre-determined condition. When the voltage level of the first power pin matches the pre-determined condition, the resistance of the impedance is adjusted to reduce the current passing through the impedance (step S330). In one embodiment, step 330 is to adjust the resistance of the equivalent impedance of the native N-type transistor or adjust the resistance of the resistor which is connected to the native N-type transistor in series.

The invention does not limit how the resistance of the equivalent impedance of the native N-type transistor is adjusted. In one embodiment, step S330 is to change the voltage difference between the gate and source of the native N-type transistor to adjust the resistance of the equivalent impedance of the native N-type transistor. For example, when the voltage difference between the gate and source of the native N-type transistor is small, the resistance of the equivalent impedance of the native N-type transistor is large. Conversely, when the voltage difference between the gate and source of the native N-type transistor is large, the resistance of the equivalent impedance of the native N-type transistor is small. When the resistance of the equivalent impedance of the native N-type transistor is large, the current passing through the native N-type transistor is small such that the power consumption is reduced.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A control circuit disposed in a connection line comprising a first power pin and a second power pin, comprising:
   a native N-type transistor comprising a first gate, a first drain and a first source, wherein the first drain is coupled to the first power pin;
   a first impedance unit coupled between the first source and the second power pin;
   a second impedance unit coupled between the first drain and the first gate, wherein when the voltage level of the first power pin is equal to a first pre-determined level, the first gate of the native N-type transistor receives an adjusting signal to adjust an equivalent impedance of the native N-type transistor, wherein when the voltage level of the first power pin is increased to a second pre-determined level, the adjusting signal is changed from a first level to a second level such that the native N-type transistor increases the equivalent impedance to reduce a current passing through the native N-type transistor, and wherein the second pre-determined level is higher than the first pre-determined level;
   a logic unit generating and adjusting a control signal according to the level of the first power pin; and
   an adjustment unit generating the adjusting signal according to the control signal to adjust the equivalent impedance, wherein when a duration during which the voltage level of the first power pin is equal to the first pre-determined level is equal to a pre-determined period, the adjustment unit adjusts the equivalent impedance according to the control signal, and wherein when the voltage level of the first power pin is unequal to the first pre-determined level or the duration during which the voltage level of the first power pin is equal to the first pre-determined level is unequal to the pre-determined period, the adjustment unit does not adjust the equivalent impedance according to the control signal.

2. The control circuit as claimed in claim 1, wherein the adjustment unit comprises:

a N-type transistor comprising a second gate, a second drain and a second source, wherein the second gate receives the control signal, the second drain is coupled to the first gate, and the second source is coupled to the second power pin; and a third impedance unit coupled between the second gate and the second source.

3. The control circuit as claimed in claim 1, wherein the native N-type transistor has a threshold voltage less than 0 and the connection between the native N-type transistor and the second impedance unit forms a diode connection type.

4. A connection line comprising:

a connection port configured to couple to a host device and comprising a first power pin and a second power pin;

a native N-type transistor comprising a first gate, a first drain and a first source, wherein the first drain is coupled to the first power pin;

a first impedance unit coupled between the first source and the second power pin;

a second impedance unit coupled between the first drain and the first gate, wherein when the voltage level of the first power pin is equal to a first pre-determined level, the first gate of the native N-type transistor receives an adjusting signal to adjust an equivalent impedance of the native N-type transistor, wherein when the voltage level of the first power pin is increased to a second pre-determined level, the adjusting signal is changed from a first level to a second level such that the native N-type transistor increases the equivalent impedance to reduce a current passing through the native N-type transistor, and wherein the second pre-determined level is higher than the first pre-determined level;

a logic unit generating a control signal according to the voltage level of the first power pin; and an adjustment unit generating the adjusting signal according to the control signal to adjust the equivalent impedance, wherein when a duration during which the voltage level of the first power pin is equal to the first pre-determined level is equal to a pre-determined period, the adjustment unit adjusts the equivalent impedance according to the control signal, and when the voltage level of the first power pin is unequal to the first pre-determined level or the duration during which the voltage level of the first power pin is equal to the first pre-determined level is unequal to the pre-determined period, the adjustment unit does not adjust the equivalent impedance according to the control signal.

5. The connection line as claimed in claim 4, wherein the connection port is a USB Type-C port.

6. The connection line as claimed in claim 4, wherein when the connection port is coupled to the host device, the host device provides a first voltage to the first power pin during a first period and provides a second voltage to the first power pin during a second period, and the equivalent impedance is adjusted during a third period, wherein the second voltage is greater than the first voltage.

7. The connection line as claimed in claim 4, wherein the adjustment unit comprises:

a N-type transistor comprising a second gate, a second drain and a second source, wherein the second gate receives the control signal, the second drain is coupled to the first gate, and the second source is coupled to the second power line; and a third impedance unit coupled between the second gate and the second source.

8. The connection line as claimed in claim 4, wherein the native N-type transistor has a threshold voltage less than 0 and the connection between the native N-type transistor and the second impedance unit forms a diode connection type.

* * * * *